(12) United States Patent
Tottori

(10) Patent No.: US 6,265,778 B1
(45) Date of Patent: Jul. 24, 2001

(54) SEMICONDUCTOR DEVICE WITH A MULTI-LEVEL INTERCONNECTION STRUCTURE

(75) Inventor: Isao Tottori, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/496,953

(22) Filed: Feb. 3, 2000

(30) Foreign Application Priority Data

Jul. 27, 1999 (JP) .................................................. 11-212469

(51) Int. Cl.[7] .......................... H01L 23/58; H01L 23/42; H01L 23/48
(52) U.S. Cl. .......................... 257/758; 257/750; 257/665; 257/529
(58) Field of Search .................................... 257/758, 750, 257/665, 529; 438/215, 132, 281, 333, 467, 601

(56) References Cited

U.S. PATENT DOCUMENTS

| | | | |
|---|---|---|---|
| 5,389,814 | * | 2/1995 | Srikrishnan et al. ................ 257/529 |
| 5,578,861 | * | 11/1996 | Kinoshita et al. .................... 257/529 |
| 5,970,346 | * | 10/1999 | Liaw .................................... 438/281 |
| 6,177,714 | * | 1/2001 | Nagai ................................... 257/529 |

FOREIGN PATENT DOCUMENTS

| | | | |
|---|---|---|---|
| 60-76140 | | 4/1985 | (JP) . |
| 3-19255 | * | 1/1991 | (JP) . |
| 3-83361 | * | 4/1991 | (JP) . |
| 9-17877 | | 1/1997 | (JP) . |

\* cited by examiner

*Primary Examiner*—Jhihan B Clark
(74) *Attorney, Agent, or Firm*—Burns, Doane, Swecker & Mathis, LLP

(57) ABSTRACT

A semiconductor device with a multi-level interconnection structure has a first conductive layer disposed below a fuse, and formed in the same layer as the first metal wire as a component of multi-level interconnects, and a second conductive layer disposed below the fuse and formed in the same layer as the second metal wire as a component of the multi-level interconnects. A laser beam control unit is configured with the first and second conductive layers. Thus, damage occurrence in a semiconductor substrate may be controlled during blowing the fuse, a quality deterioration and further a defective of the semiconductor device may be not only avoided, but also an integration degree thereof may be enhanced.

6 Claims, 8 Drawing Sheets

SEMICONDUCTOR DEVICE WITH A MULTI-LEVEL INTERCONNECTION STRUCTURE

BACKGROUND OF THE INVENTION

1. Field of the Invention

The present invention relates to a semiconductor device with a multi-level interconnection structure, and more particularly, to multi-level interconnects in which wires are formed in upper layers above a semiconductor substrate provided with a semiconductor component.

2. Description of the Prior Art

FIG. 9 is a sectional view illustrating a construction of a conventional semiconductor device with a multi-layer interconnection structure. FIG. 10 is a sectional view illustrating a schematic construction in a fuse of a conventional semiconductor device with a multi-level interconnection structure. In the drawings, reference numeral 101 denotes a semiconductor device with a multi-level interconnection structure, numeral 2' denotes a 20 semiconductor substrate, numeral 3' denotes a memory region such as a DRAM block, numeral 4' denotes a peripheral circuit region such as a logic block, numeral 5' denotes a stacking memory cell of DRAM as a semiconductor component created in the memory regions 3', numerals 6a', 6b' denote transistors such as NMOS and PMOS formed in the peripheral region 4', numerals 61'–63' denote dielectric films, numerals C1', C2' denote contacts, and numeral 7' denote multilevel interconnects which are constructed in the upper layers over the DRAM memory cell 5'.

In the DRAM memory cell 5', reference numeral 11' denotes a bit line made of a refractory metal such as tungsten, or polysilicon, numeral 12' denotes a word line constituting a silicide with a refractory metal such as tungsten and molybdenum, numeral 13' denotes a cell plate made of polysilicon, numeral 14' denotes a storage node made of polysilicon as well, and numeral 15' denotes a dielectric layer intervening between the cell plate 13' and the storage node 14', and the dielectric layer 15' is constituted by a multi-layered film with nitride and oxide films.

In the multi-level interconnects 7', reference numeral 71' denotes a first interlayer dielectric, numeral 72' denotes a second interlayer dielectric, numeral 73' denotes a third interlayer dielectric, numeral 21' denotes a first metal wire, numeral 22' denotes a second metal wire, numeral 23' denotes a third metal wire, numeral 24' denotes a fourth metal wire, and reference symbols V1'–V3' designate via contacts formed in the interlayer dielectrics 71'–73' respectively, and for electrically interconnecting with the upper and lower metal wires, the via contacts V1'–V3', typically made of aluminum or aluminum alloys, as well as the metal wires 21'–24'.

In addition, reference numeral 31' denotes a fuse formed in the same layer as the third metal wire 23' as a component of the multi-level interconnects 7' in the vicinity of the boundary of the memory region 3' and the peripheral circuit region 4'. The fuse 31' is used for replacing a defective DRAM memory cell 5' caused in the manufacturing processes with a redundancy memory cell.

FIG. 9 illustrates one example of a construction of a semiconductor device with a multi-level interconnection structure, and designates that a memory including a DRAM memory cell as a component is formed in the memory regions 3' and that a peripheral circuit including the transistors 6a', 6b' as a component in the peripheral circuit region 4'. In FIG. 9, a part of the components of the DRAM memory cell 5' and transistors 6a', 6b' is abbreviated (as not shown). Additionally the hatching in FIGS. 9 and 10 is partially abbreviated for simplicity.

A description will now be given of the operation. When the defective DRAM memory cell 5' caused in the manufacturing processes is replaced with a redundancy memory cell, first a wafer test is executed, and then a laser beam P is applied to the fuse 31' to be blown based on the test results as shown in FIG. 11. When the laser beam P is applied to the fuse 31', the energy of the laser beam P is absorbed in the fuse 31', to be fused and blown. As a result, the redundancy circuit becomes available. Thus, the defective DRAM memory cell 5' may be replaced with the redundancy memory cell.

There are the prior arts disclosed in the patent documents of Japanese patent laid open publication numbers JP-A-60/76140 and JP-A-9/17877 for reference of the present invention.

FIG. 12 is a sectional view illustrating a fuse in a semiconductor device in JP-A-60/76140. In the drawing, reference numeral 111 denotes a semiconductor device, numeral 112 denotes a semiconductor substrate, numeral 113 denotes a field oxide film, numeral 114 denotes a fuse, numeral 115 denotes a PSG (phosphosilicate glass) film covering the fuse 114, numeral 116 denotes a conductive layer formed on the field oxide film 113 below the fuse 114, and numeral 117 denotes a dielectric film formed between the fuse 114 and the conductive layer 116.

In the art, it is assumed that the fuse 114 and the conductive layer 116 are formed by polysilicon, a refractory metal, or a silicide compound thereof, and are formed simultaneously during the formation of word lines or bit lines as a component of memory cells. However, the conductive layer disposed below the fuse 114 is merely one layer, illustrating a mono-layer wiring structure.

FIG. 13 is a sectional view illustrating a fuse of a semiconductor device in JP-A-9/17877. In the drawing, reference numeral 121 denotes a semiconductor device, numeral 122 denotes a fuse, and numeral 123 denotes a conductive layer formed below the fuse 122. In the art, the conductive layer 123 is merely used as a means for reflecting laser beams.

SUMMARY OF THE INVENTION

Since a semiconductor device with a multi-level interconnection structure has the above construction in the prior art as described above, when the fuse 31 is blown by the application of the laser beam P, the laser beam which has not been completely absorbed in the fuse 31 penetrates this area after blown transmits the lower side of the fuse 31 and reaches up to the semiconductor substrate 2, thereby causing a damage 2a to the semiconductor substrate 2 located below the fuse 31. Hence, there is a problem that a quality of the semiconductor device with a multi-level interconnection structure is not only deteriorated, but also the device itself may becomes a defective.

In addition, when a semiconductor element is provided in the semiconductor substrate 2 below the fuse 31, the laser beam reaching to the substrate 2 destroys the semiconductor element. Hence, there is a problem that the semiconductor element cannot be provided in the substrate 2 below the fuse 31.

The present invention has been made to solve the above-described problems, and it is an object of the present invention to obtain a semiconductor device with a multilevel interconnection structure in which a laser beam applied to blow a fuse has a small possibility to reach up to a semiconductor substrate located below the fuse.

In accordance with a preferred embodiment of the present invention, a semiconductor device with a multi-level interconnection structure comprises: a semiconductor substrate formed with a semiconductor element; a dielectric film covering the element; a first wire formed on the dielectric film so as to electrically connect with the element or substrate through a contact formed in the dielectric film; a first interlayer dielectric formed on the first wire and the dielectric film; a second wire formed on the first dielectric film so as to electrically connect with the first wire through a via contact formed in the first interlayer dielectric; a second interlayer dielectric formed on the second wire and the first interlayer dielectric; a third wire formed on the second interlayer dielectric so as to electrically connect with the second wire through a via contact formed in the second interlayer dielectric; a fuse formed in the same layer as a conductive layer providing the second wire; and a laser beam control unit created from a conductive layer which is disposed below the fuse and is formed in the same layer as the first wire.

In the semiconductor device with a multi-level interconnection structure as another preferred embodiment of the present invention comprises: a semiconductor substrate formed with a semiconductor element; a dielectric film covering the element; a first wire formed on the dielectric film so as to electrically connect with the element or substrate through a contact formed in the dielectric film; a first interlayer dielectric formed on the first wire and the dielectric film; a second wire formed on the first dielectric film so as to electrically connect with the first wire through a via contact formed in the first interlayer dielectric; a second interlayer dielectric formed on the second wire and the first interlayer dielectric; a third wire formed on the second interlayer dielectric so as to electrically connect with the second wire through a via contact formed in the second interlayer dielectric; a third interlayer dielectric formed on the third wire and the second interlayer dielectric; a fourth wire formed on the third interlayer dielectric so as to electrically connect with the third wire through a via contact formed in the third interlayer dielectric; a fuse formed in the same layer as a conductive layer providing the third wire; and a laser beam control unit created from at least one conductive layer which is disposed below the fuse, the control unit being formed on the same layer as the first or second wire or being formed on the same layers as the first and second wires.

In the semiconductor device with a multi-level interconnection structure as another preferred embodiment of the present invention, each of the semiconductor layers included in the laser beam control unit is provided with a dummy pattern.

In the semiconductor device with a multi-level interconnection structure as another preferred embodiment of the present invention, there is provided with a semiconductor element on the substrate under the laser beam control unit positioned below the fuse.

BRIEF DESCRIPTION OF THE DRAWINGS

These and other objects, features, aspects and advantages of the present invention will become more apparent from the following detailed description of the present invention when taken in conjunction with the accompanying drawings, in which.

DETAILED DESCRIPTION OF THE PREFERRED EMBODIMENTS

Other features of this invention will become apparent through the following description of preferred embodiments which are given for illustration of the invention and are not intended to be limiting thereof.

Preferred embodiments of the semiconductor device with a multi-level interconnection structure according to the present invention will now be described with reference to the drawings.

First Embodiment

Figure 1:
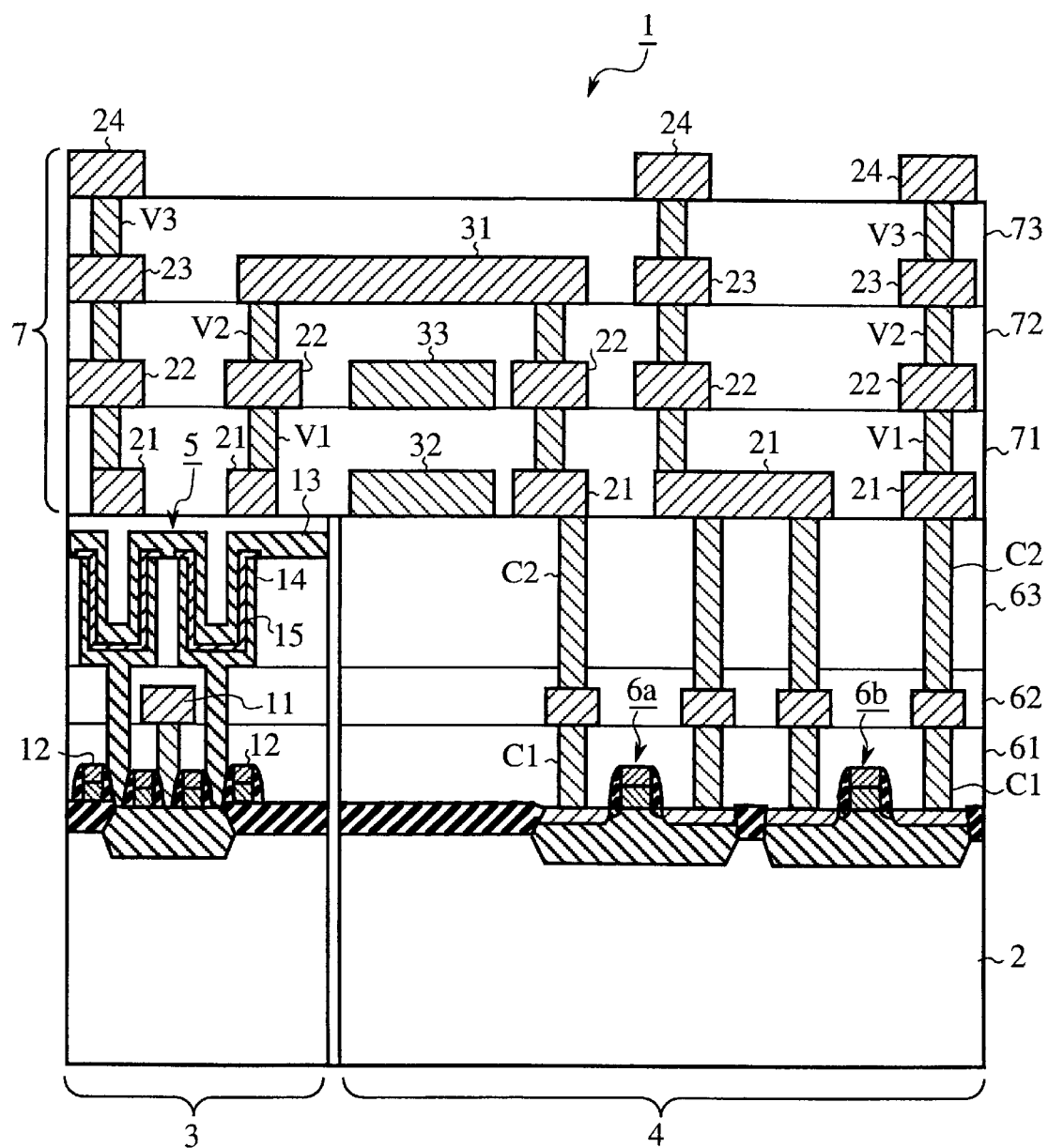
FIG. 1 is a sectional view illustrating a construction of a semiconductor device with a multi-level interconnection structure according to the first embodiment of the present invention.
Figure 2:
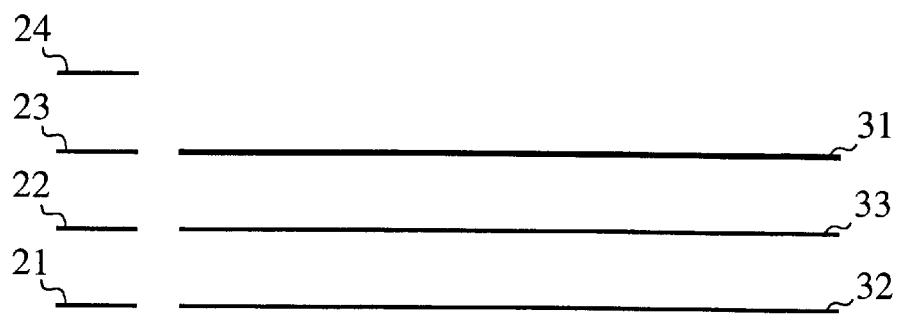
FIG. 2 is a sectional view illustrating a schematic construction in a fuse of the semiconductor device with a multilevel interconnection structure according to the first embodiment of the present invention.

FIG. 1 is a sectional view illustrating a construction of a semiconductor device with a multi-level interconnection structure according to the first embodiment of the present invention. FIG. 2 is a sectional view illustrating a schematic construction in a fuse of a conventional semiconductor device with a multi-level interconnection structure according to the first embodiment of this invention. In the drawings, reference numeral 1 denotes a semiconductor device with a multi-level interconnection structure, numeral 2 denotes a semiconductor substrate, numeral 3 denotes a memory region such as a DRAM block, numeral 4 denotes a peripheral circuit region such as a logic block, numeral 5 denotes a stacking memory cell of DRAM as a semiconductor component created in the memory region 3, numerals 6a, 6b denote transistors such as NMOS and PMOS formed in the peripheral region 4, numerals 61–63 denote dielectric films, numerals C1, C2 denote contacts, and numeral 7 denote multi-level interconnects which are constructed in the upper layers over the DRAM memory cell 5.

In the DRAM memory cell 5, reference numeral 11 denotes a bit line made of a refractory metal such as tungsten, or polysilicon, numeral 12 denotes a word line constituting a silicide with a refractory metal such as tungsten and molybdenum, numeral 13 denotes a cell plate made of polysilicon, numeral 14 denotes a storage node made of polysilicon as well, and numeral 15 denotes a dielectric layer intervening between the cell plate 13 and the storage node 14, and the dielectric layer 15 is constituted by a multi-layered film of nitride and oxide films.

In the multi-level interconnects 7, reference numeral 71 denotes a first interlayer dielectric, numeral 72 denotes a second interlayer dielectric, numeral 73 denotes a third interlayer dielectric, numeral 21 denotes a first metal wire, numeral 22 denotes a second metal wire, numeral 23 denotes a third metal wire, numeral 24 denotes a fourth metal wire, and reference symbols V1–V3 designate via contacts formed in the interlayer dielectrics 71–73 respectively, and for electrically interconnecting with the upper and lower metal wires, the via contacts V1–V3 typically made of aluminum or aluminum alloys, as well as the metal wires 21–24. The first and second metal wires 21, 22, the second and third wires 22, 23, and the third and fourth wires 23, 24 are electrically connected with each other through the via contacts V1–V3 or through holes, respectively.

In addition, reference numeral 31 denotes a fuse formed in the same layer as the third metal wire 23 as a part of the multi-level interconnects 7 in the vicinity of the boundary of the memory regions 3 and the peripheral circuit regions 4. The fuse 31 is formed simultaneously during the formation of the third metal layer 23. A large number of fuses 31 are formed in the semiconductor device 1 (as not shown in FIG. 1). The fuse 31 is used for replacing a defective DRAM cell 5 caused in the manufacturing processes with a redundancy memory cell. In general, the fuse 31 is formed on the same layer as a first or second metal layer from the top.

Further, reference numeral 32 denotes a conductive layer positioned below the fuse 31 and formed on the same layer as the first metal layer 21 as a component of the multi-level interconnects 7, and numeral 33 denotes a second conductive layer positioned below the fuse 31 and formed on the same layer as the second metal layer 22 as a component of the multi-level interconnects 7. The first conductive layer 32 is formed simultaneously on the formation of the first metal layer 21, while the second conductive layer 33 is formed simultaneously on the formation of the second metal layer 22. The first conductive layer 32 and the second conductive layer 33 serve as a laser beam control means for scattering the superfluous laser beam, which has not been fully absorbed in the fuse 31, with absorption and reflection when the beam is applied to blow the fuse 31. The first and second conductive layers 32, 33 constitute a laser control unit. When the application of the laser beam is slightly out of the position, pattern figures of the first and second conductive layers 32, 33 are preferably larger than that of the fuse 31 in an incident direction of the laser beam.

Figure 9:
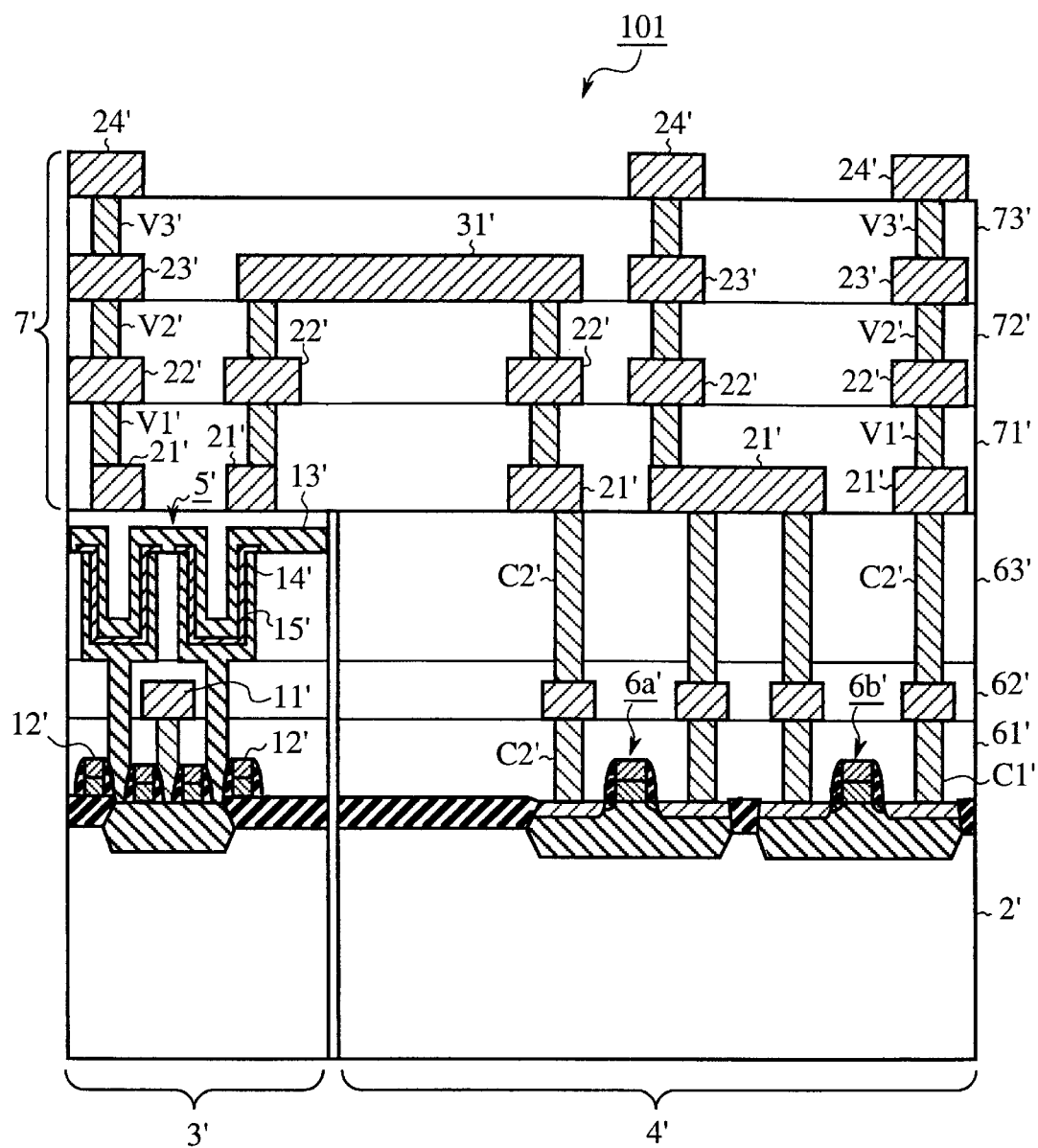
FIG. 9 is a sectional view illustrating a construction of a conventional semiconductor device with a multi-level interconnection structure.
Figure 10:
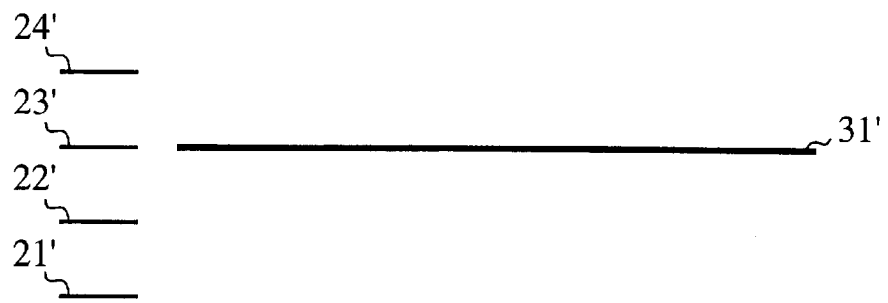
FIG. 10 is a sectional view illustrating a schematic construction of a fuse in a conventional semiconductor device with a multi-level interconnection structure.
Figure 10:
Figure 11:
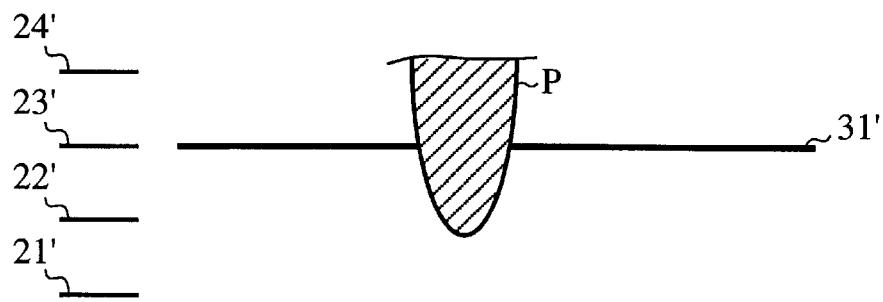
FIG. 11 is a sectional view illustrating a schematic construction of a fuse in the conventional semiconductor device with a multi-level interconnection structure.
Figure 11:
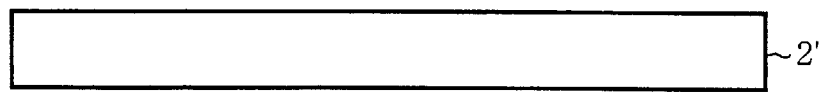
Figure 12:
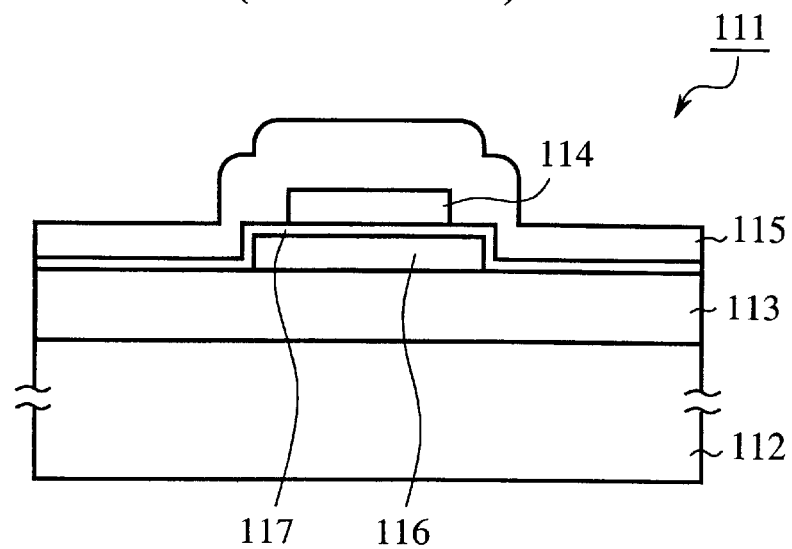
FIG. 12 is a sectional view illustrating a fuse in a conventional semiconductor device.
Figure 13:
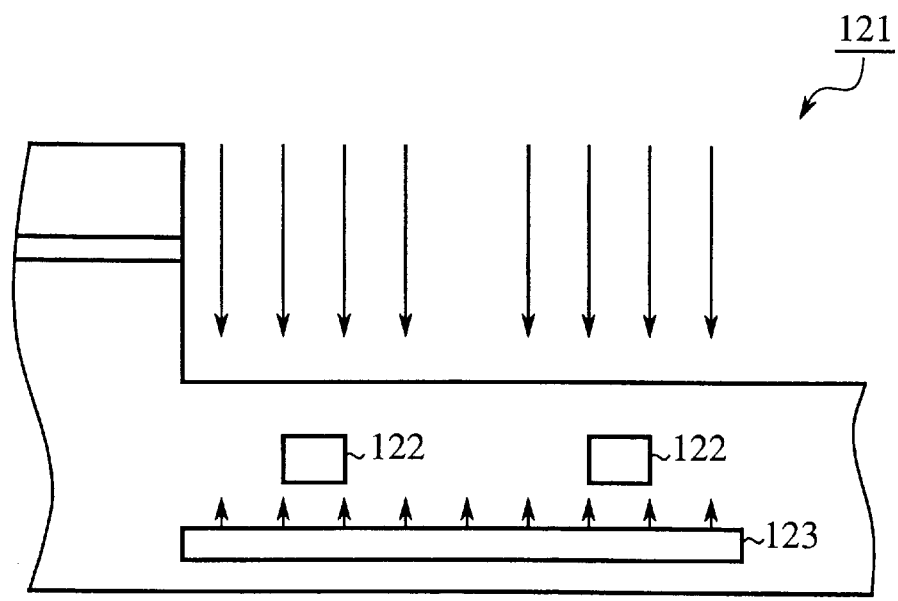
FIG. 13 is a sectional view illustrating a fuse in a conventional semiconductor device.

Here, FIG. 1 illustrates one example of a construction of a semiconductor device with a multi-level interconnection structure: a memory including a semiconductor element such as the DRAM memory cell 5 as a component is created in the memory region 3, and a peripheral circuit including the transistors 6a, 6b as components is formed in the peripheral circuit region 4. The semiconductor element means an electrical part such as transistor, diode, resistor, coil, and capacitor, and a composite thereof, especially including a memory cell consisting of these parts and involved in DRAM, SRAM, and so on. In FIG. 9, a part of the components of the DRAM memory cell 5 and transistors 6a, 6b is abbreviated (as not shown). Additionally the hatching in FIGS. 1 and 2 is partially abbreviated for simplicity.

Figure 3:
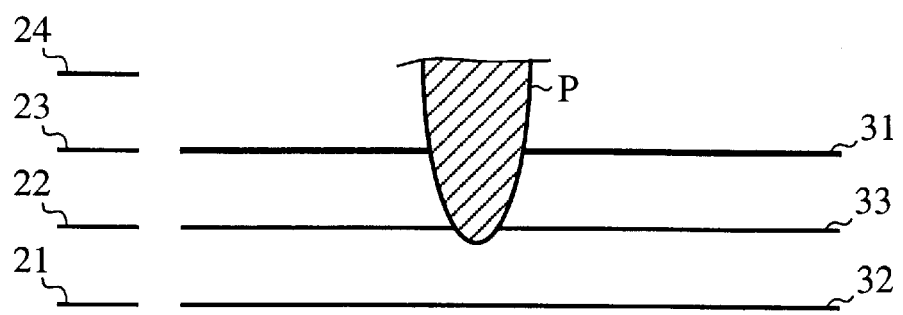
FIG. 3 is an explanatory view in operation of the semiconductor device with a multi-level interconnection structure according to the first embodiment of the present invention.
Figure 3:

A description will now be given of the operation. When the defective DRAM memory cell 5 caused in the manufacturing processes is replaced with a redundancy memory cell, first a wafer test is executed, and then a laser beam P is applied to the fuse 31 to be blown based on the test results as shown in FIG. 3. When the laser beam P is applied to the fuse 31, the energy of the laser beam P is absorbed in the fuse 31, to be fused and blown. As a result, the redundancy circuit becomes available. Thus, the failed DRAM memory cell 5 may be replaced with the redundancy memory cell, while the superfluous laser beam not fully absorbed in the fuse 31 is scattered with absorption and reflection, thereby preventing an occurrence of radiant heat and interference beam due to the laser beam. In this manner, the defective DRAM memory cell may be replaced with a redundancy memory cell while damage to the semiconductor substrate 2 below the fuse 31 is prevented.

As described above, according to the first embodiment, since the laser beam control unit comprising the first conductive layer 32 and the second conductive layer 33 is disposed below the fuse 31, the superfluous laser beam applied to blow the fuse 31 and not completely absorbed in the fuse 31 is scattered with absorption and reflection by the first and second conductive layers 32, 33. Therefore, a possibility of causing damage to the semiconductor substrate 2 below the fuse 31 is small, and a quality of the semiconductor device with a multi-level interconnection structure is favorable with an improved product yield.

Figure 4:
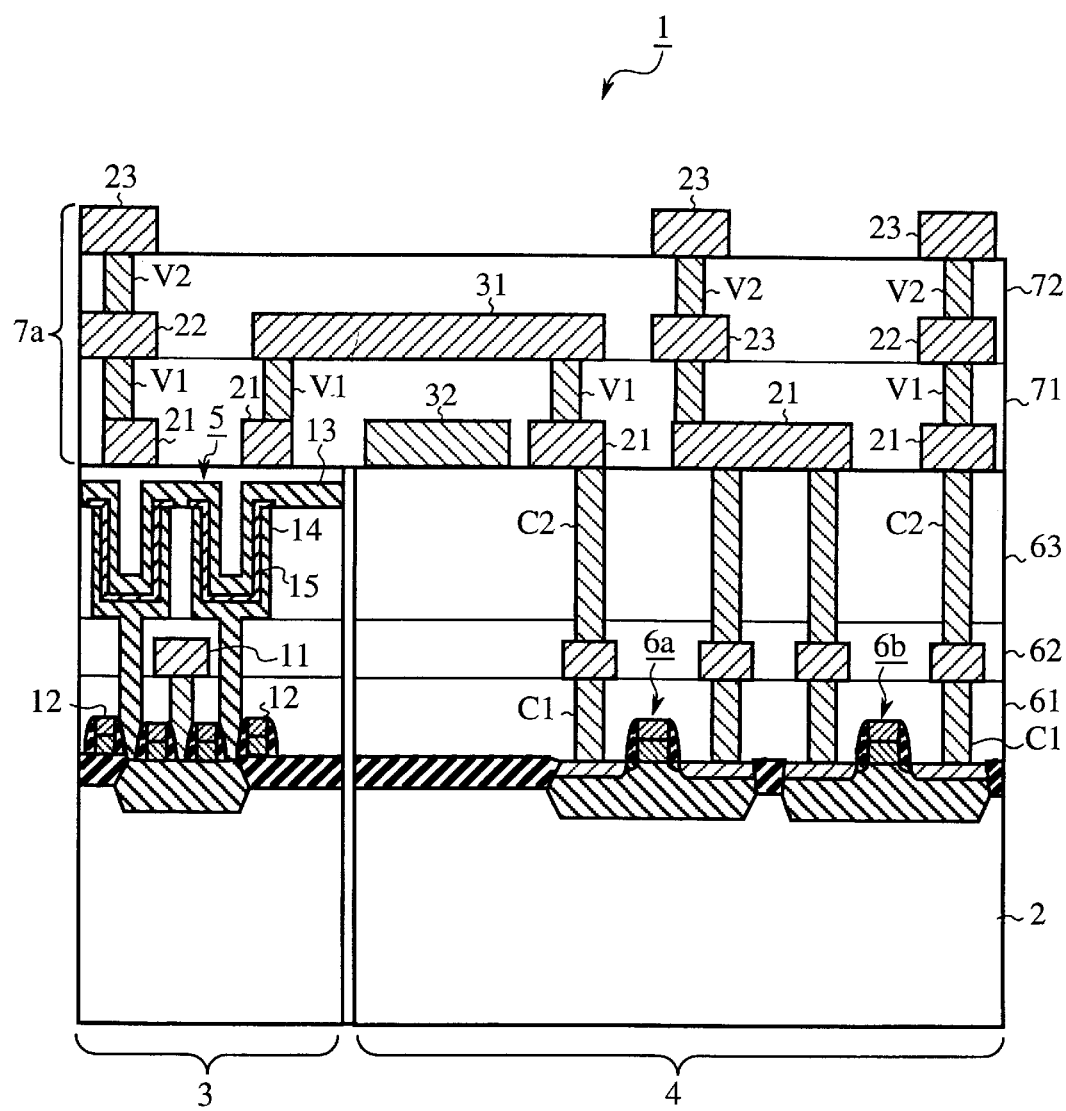
FIG. 4 is a sectional view illustrating a construction in another form of a semiconductor device with a multi-level interconnection structure according to the first embodiment of the present invention.

Further, a sectional construction in FIG. 4 may be schemed as another form of the above first embodiment. The construction in FIG. 4 is different from that in FIG. 1 in the following: multi-level interconnects 7a comprise interlayer dielectrics 71, 72 of two layers through via contacts V1, V2, and metal wires 21–23 of three layers; since the fuse 31 is formed on the same layer as the second metal wire 22, a conductive layer as a feature should be formed on the same layer as the first metal wire 21. Also in this manner, when a laser beam P is applied to a fuse 31 to be blown during the redundancy process and is not absorbed in the fuse 31, the conductive layer 32 formed below the fuse 31 scatters the fuse-through beam with absorption and reflection due to the laser beam, thereby controlling an occurrence of radiant heat and interference beam. Therefore, a defective DRAM memory cell 5 may be replaced with a redundancy cell with prevention of causing damage to a semiconductor 2 located below the fuse 31 and to a semiconductor element formed therein. Consequently, a quality of the semiconductor device with a multi-level interconnection structure is favorable with an improved yield.

Second Embodiment

In this embodiment, it will be described as to an aspect that the first and second conductive layers 32, 33 of the semiconductor device 1 with a multi-level interconnection structure according to Embodiment 1 are provided with dummy patterns. The dummy pattern means a polygon-shaped conductive layer placed in a given interval between conductive layers functioning as wires, so as to obtain a favorable flat surface in a planarization process of a wafer surface such as CMP (chemical mechanical polishing) process.

Figure 5:
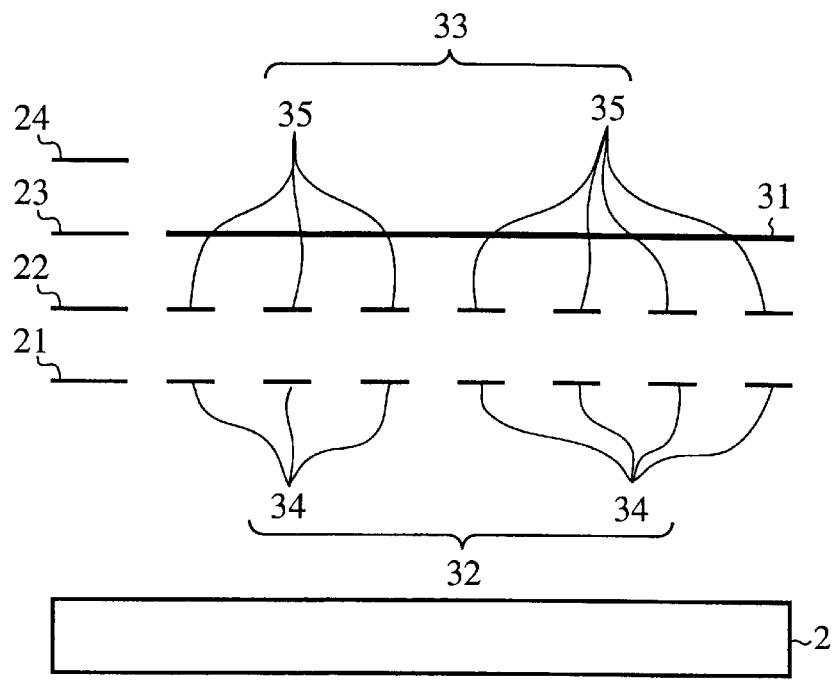
FIG. 5 is a sectional view illustrating a schematic construction of a fuse in a semiconductor device with a multi-level interconnection structure according to the second embodiment of the present invention.

FIG. 5 is a sectional view illustrating a schematic construction of a fuse in a semiconductor device with a multi-level interconnection structure according to the second embodiment of the present invention. In the drawing, reference numeral 34 denotes a first dummy pattern positioned below a fuse 31 and formed on the same layer as a first metal wire 21 as a component of multi-level interconnects 7, and numeral 35 denotes a second dummy pattern positioned below the fuse 31 as well and formed on the same layer as a second metal wire 22 as a component of the multi-level interconnects 7. The first dummy pattern 34 is formed simultaneously on the formation of the first metal wire 21, and the second dummy pattern 35 on the formation of the second metal wire 22. The first and second dummy patterns 34, 35 are used for absorbing and reflecting the superfluous laser beam not fully absorbed in the fuse 31 when the beam is applied to blow the fuse 31. The first conductive layer 32 is composed of a plurality of the first dummy pattern 34, and the second conductive layer 33 a plurality of the second dummy pattern 35. A laser beam control unit as a laser beam absorption means comprises the first conductive layer 32 and the second conductive layer 33. It should be noted that the dummy pattern is automatically created in an integrated circuit layout and produces a grid having a regular area, thus imperfectly embedding a desired region under the fuse 31, and thereby has to be given by a structure formed with two layers or more. The other components here are similar to those in the first embodiment, and its detailed description will be omitted.

Figure 6:
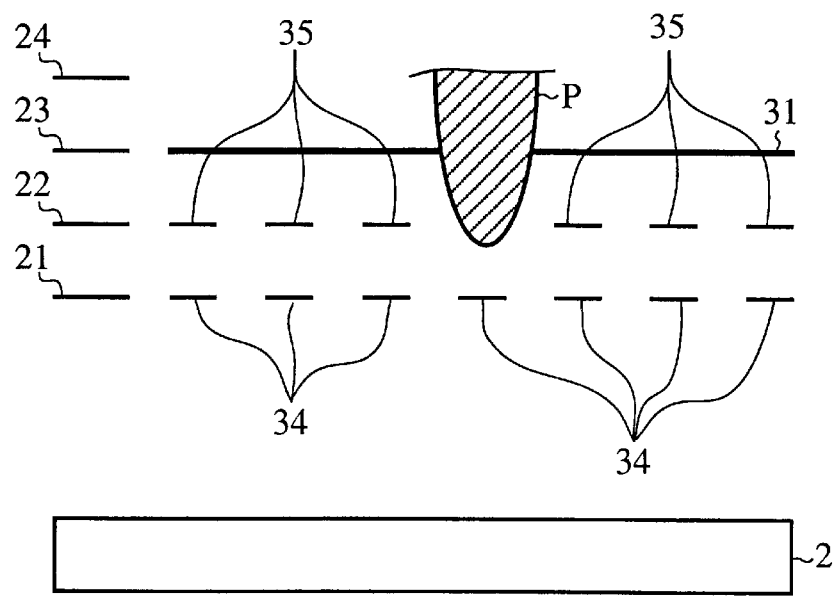
FIG. 6 is an explanatory view in operation of the semiconductor device with a multi-level interconnection structure according to the second embodiment of the present invention.

A description will now be given of the operation. When a defective DRAM memory cell 5 caused in the manufacturing processes is replaced with a redundancy memory cell, first a wafer test is executed, and then a laser beam P is applied to the fuse 31 to be blown based on the test results as shown in FIG. 6. When the laser beam P is applied to the fuse 31, the energy of the laser beam P is absorbed in the fuse 31, to be fused and blown, and the superfluous laser beam not fully absorbed in the fuse 31 is scattered with absorption and reflection by the first and second dummy patterns 34, 35, which are formed below the fuse 31. In this manner, the defective DRAM memory cell 5 may be replaced with a redundancy memory cell as damage to the semiconductor substrate 2 located below the fuse 31 is prevented.

As described above, according to the second embodiment, since the laser beam control unit comprising the first conductive layer 32 having a plurality of the first dummy patterns 34 and the second conductive layer 33 having a plurality of the second dummy patterns 35 is disposed below the fuse 31, the superfluous laser beam applied to blow the fuse 31 and not fully absorbed in the fuse 31 is scattered with absorption and reflection by the first and second dummy patterns 34, 35. Therefore, a possibility of causing damage to the semiconductor substrate 2 below the fuse 31 is small, and a quality of the semiconductor device with a multi-level interconnection structure is favorable.

Third Embodiment

In this embodiment, it will be described as to an aspect that a transistor is provided as a semiconductor element below the fuse 31 in the semiconductor device 1 with a multi-level interconnection structure according to the first embodiment.

Figure 7:
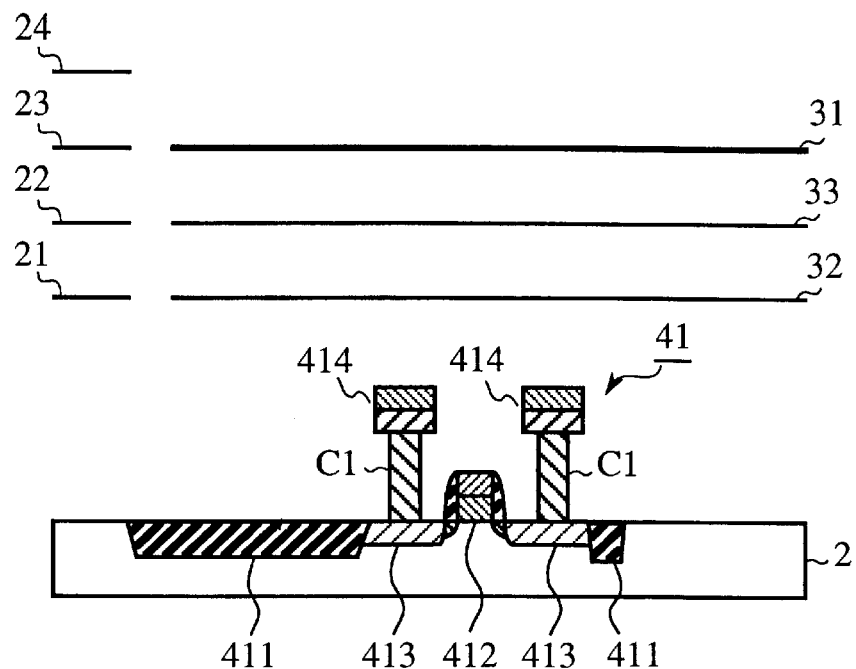
FIG. 7 is a sectional view illustrating a schematic construction of a fuse in a semiconductor device with a multi-level interconnection structure according to the third embodiment of the present invention.

FIG. 7 is a sectional view illustrating a schematic construction of a fuse in a semiconductor device with a multi-level interconnection structure. In the drawing, reference numeral 41 denotes a MOS transistor including a memory cell and so on and created on the semiconductor substrate 2, mark Cl designates a contact, numeral 411 denotes a field oxide film, numeral 412 denotes a word line having a bi-level structure of refractory metal and polysilicon, numeral 413 denotes a well region such as source and drain, numeral 414 denotes a capacitor having a dielectric layer intervened between a cell plate and a storage node The other components are similar to those of the first embodiment, and the detailed description thereof will be omitted.

Figure 8:
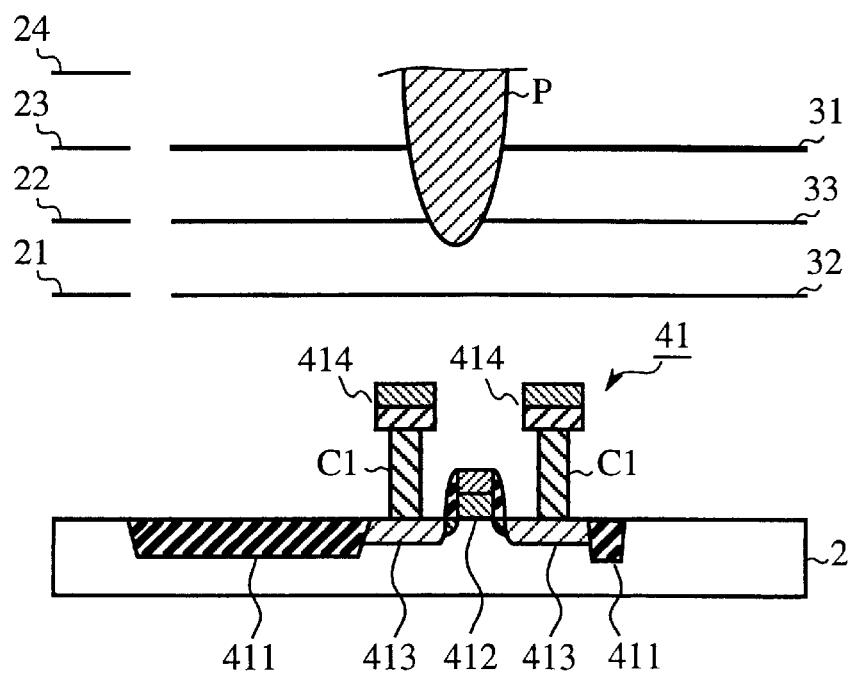
FIG. 8 is an explanatory view in operation of the semiconductor device with a multi-level interconnection structure according to the third embodiment of the present invention.

A description will now be given of the operation. When a defective DRAM memory cell 5 caused in the manufacturing processes is replaced with a redundancy memory cell, first a wafer test is executed, and then a laser beam P is applied to the fuse 31 to be blown based on the test results as shown in FIG. 8 When the laser beam P is applied to the fuse 31, the energy of the laser beam P is absorbed in the fuse 31, to be fused and blown, and the superfluous laser beam not fully absorbed in the fuse 31 is scattered with absorption and reflection by the first and second conductive layers 32, 33, which are formed below the fuse 31. In this manner, while destruction of the transistor 41 formed below the fuse 31 is prevented, the defective DRAM memory cell 5 may be replaced with a redundancy memory cell.

As described above, according to the third embodiment, since the laser beam control unit comprised of the first and second conductive layers 32, 33 is provided below the fuse 31, and the transistor 41 is created on the semiconductor substrate 2 located below the fuse 31, resulting in a higher integration degree of the semiconductor device with a multi-level interconnection structure.

In addition, it is described in this embodiment that the transistor 41 as a semiconductor element is provided on the semiconductor substrate 2 under the fuse 31 of the semiconductor device 1 with a multi-level structure according to the first embodiment. However, the same effect is obtained even when the transistor as a semiconductor element is provided in a specific region on the semiconductor substrate 2 under the fuse 31.

Moreover, it is described in the above-mentioned embodiment that the transistor as a semiconductor element is provided. Instead of the transistor, the same effect is obtained for one aspect provided with a resistor, a capacitor and the like as a semiconductor element.

The aforementioned embodiments, the multi-level interconnects is illustrated with tri-level and tetra-level structures: a single fuse is disposed in the same layer as the second wire in the tri-level, and two fuses in the same layers as the second and third wires in the tetra-level. However, that multi-level interconnects 7, 7a may be configured with penta-level or more. Further, the fuse may be formed in the same layer as the top wire, and the fuse may be disposed in the same layer as the third or more metal wire.

As described above in detail, according to the present invention, a semiconductor device with a multi-level interconnection structure comprises: a fuse formed in the same layer as a wire serving as a component of multi-level interconnects; and a laser beam control unit formed with at least one conductive layer disposed below the fuse, the conductive layer being formed in the same layer as either wire of the multi-level interconnects. In this configuration, the superfluous laser beam applied to blow the fuse and not fully absorbed therein is scattered with absorption and reflection by the laser beam control unit including the conductive layer disposed below the fuse. Therefore, the semiconductor device with a multi-level interconnection structure may be provided with a small possibility of causing damage to the semiconductor substrate below the fuse and with a favorable quality as well as an improved product yield.

According to the present invention, the semiconductor device with a multi-level interconnection structure is configured such that the conductive layer included in the laser beam control unit is provided with the dummy pattern. Thus, the superfluous laser beam applied to blow the fuse and not fully absorbed therein is scattered with absorption and reflection by the laser beam control unit including at least one of the dummy pattern positioned below the fuse. Therefore, the semiconductor device with a multi-level interconnection structure may be provided with a small possibility of causing damage to the semiconductor substrate below the fuse and with a favorable quality as well as an improved product yield.

According to the/present invention, the semiconductor device with a multi-level interconnection structure is configured such that a semiconductor element is provided on the substrate under the laser beam control unit positioned below the fuse, thereby obtaining that semiconductor device having a higher integration degree.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. A semiconductor device with a multi-level interconnection structure comprising:
   a semiconductor substrate formed with a semiconductor element;
   a dielectric film covering said element;
   a first wire formed on said dielectric film so as to electrically connect with said element or substrate through a contact formed in said dielectric film;
   a first interlayer dielectric formed on said first wire and said dielectric film;
   a second wire formed on said first dielectric film so as to electrically connect with said first wire through a via contact formed in said first interlayer dielectric;
   a second interlayer dielectric formed on said second wire and said first interlayer dielectric;
   a third wire formed on said second interlayer dielectric so as to electrically connect with said second wire through a via contact formed in said second interlayer dielectric;
   a fuse formed in the same layer as a conductive layer providing said second wire; and
   a laser beam control unit created from a conductive layer which is disposed below said fuse and is formed in the same layer as said first wire.

2. The semiconductor device according to claim 1, wherein said conductive layer included in said laser beam control unit is provided with a dummy pattern.

3. The semiconductor device according to claim 1, further comprising a semiconductor element on said substrate under said laser beam control unit positioned below said fuse.

4. A semiconductor device with a multi-level interconnection structure comprising:
   a semiconductor substrate formed with a semiconductor element;
   a dielectric film covering said element;
   a first wire formed on said dielectric film so as to electrically connect with said element or substrate through a contact formed in said dielectric film;
   a first interlayer dielectric formed on said first wire and said dielectric film;
   a second wire formed on said first dielectric film so as to electrically connect with said first wire through a via contact formed in said first interlayer dielectric;
   a second interlayer dielectric formed on said second wire and said first interlayer dielectric;
   a third wire formed on said second interlayer dielectric so as to electrically connect with said second wire through a via contact formed in said second interlayer dielectric;
   a third interlayer dielectric formed on said third wire and said second interlayer dielectric;
   a fourth wire formed on said third interlayer dielectric so as to electrically connect with said third wire through a via contact formed in said third interlayer dielectric;
   a fuse formed in the same layer as a conductive layer providing said third wire; and
   a laser beam control unit created from at least one conductive layer which is disposed below said fuse, said control unit being formed on the same layer as said first or second wire or being formed on the same layers as said first and second wires.

5. The semiconductor device according to claim 4, wherein said conductive layer included in said laser beam control unit is provided with a dummy pattern.

6. The semiconductor device according to claim 2, further comprising a semiconductor element on said substrate under said laser beam control unit positioned below said fuse.

* * * * *